(12) United States Patent
Qian et al.

(10) Patent No.: US 10,446,634 B2
(45) Date of Patent: Oct. 15, 2019

(54) FLEXIBLE DISPLAY PANEL AND FLEXIBLE DISPLAY DEVICE

(71) Applicant: Tianma Micro-Electronics Co., Ltd., Shenzhen (CN)

(72) Inventors: Xu Qian, Shenzhen (CN); Wenxin Jiang, Shenzhen (CN); Yuan Li, Shenzhen (CN)

(73) Assignee: TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 15/880,672

(22) Filed: Jan. 26, 2018

(65) Prior Publication Data

US 2019/0035871 A1    Jan. 31, 2019

(30) Foreign Application Priority Data

Jul. 28, 2017    (CN) .......................... 2017 1 0631145

(51) Int. Cl.
  *H01L 27/32*    (2006.01)
  *H01L 51/52*    (2006.01)
  *H01L 51/00*    (2006.01)

(52) U.S. Cl.
  CPC ...... *H01L 27/3272* (2013.01); *H01L 27/3276* (2013.01); *H01L 51/0097* (2013.01);
  (Continued)

(58) Field of Classification Search
  CPC ............. H01L 27/3272; H01L 51/0097; H01L 51/5246; H01L 27/3276; H01L 51/5243; H01L 2251/5338
  See application file for complete search history.

(56) References Cited

U.S. PATENT DOCUMENTS

| 2005/0275038 A1* | 12/2005 | Shih | ................. H01L 29/78633 257/382 |
| 2015/0102324 A1* | 4/2015 | Lee | ..................... H01L 27/3244 257/40 |

(Continued)

FOREIGN PATENT DOCUMENTS

| CN | 103226920 A | 7/2013 |
| CN | 205539836 U | 8/2016 |
| CN | 206249279 U | 6/2017 |

OTHER PUBLICATIONS

Chinese Office Action dated Mar. 19, 2019 for corresponding Chinese Patent Application No. 201710631145.5.

*Primary Examiner* — Su C Kim
(74) *Attorney, Agent, or Firm* — Tarolli, Sundheim, Covell & Tummino LLP

(57) ABSTRACT

The present disclosure discloses a flexible display panel and a flexible display device. The flexible display panel includes a first flexible substrate, a buffer layer, a display function layer, and a conduction function layer. The buffer layer and the display function layer are placed on a first side of the first flexible substrate. The conduction function layer is placed between the first flexible substrate and the display function layer, and is connected to a constant potential through a through-hole or by an end portion of the conduction function layer. By arranging the conduction function layer and connecting to the constant potential, an external interference signal from a back side of the substrate can be effectively shielded, and the conduction function layer can also serve as a blocking layer.

18 Claims, 11 Drawing Sheets

(52) U.S. Cl.
CPC ...... *H01L 51/5246* (2013.01); *H01L 51/5243* (2013.01); *H01L 2251/5338* (2013.01)

(56) References Cited

U.S. PATENT DOCUMENTS

2015/0270512 A1* 9/2015 Yamae ................ H01L 51/5268
　　　　　　　　　　　　　　　　　　　　　257/40
2017/0062541 A1* 3/2017 Ishiyama ............ H01L 27/3272

* cited by examiner

FLEXIBLE DISPLAY PANEL AND FLEXIBLE DISPLAY DEVICE

CROSS-REFERENCE TO RELATED APPLICATIONS

The present application claims the benefit of priority to Chinese Patent Application No. 201710631145.5, filed on Jul. 28, 2017, the content of which is incorporated herein by reference in its entirety.

BACKGROUND

With the development of display technologies, the flexible display technology becomes one of the important trends, which can meet users' various requirements on, for example, lightweight, portable, low power consumption, outstanding image quality, flexibility and the like. In various implementing manners of the flexible display, an organic light-emitting diode (OLED) display technology attracts wide attentions because of its advantages such as self-illumination, wide angel of view, low power consumption, extremely high response speed and so on.

OLED generally includes an anode electrode, a cathode electrode, and an organic compound layer formed between the anode electrode and the cathode electrode. The organic compound layer generally includes a hole injection layer, a hole transmission layer, a light-emitting layer, an electron transmission layer, and an electron injection layer. When a power source provides an applicable drive voltage, the cathode electrode will discharge electronegative electrons, and the electrons discharged by the cathode electrode is transmitted to the light-emitting layer by the electron transmission layer passing through the electron injection layer; the anode electrode discharges electropositive holes, and the electropositive holes are transmitted to the light-emitting layer by the hole transmission layer passing through the hole injection layer. Once an applicable drive voltage is applied on the anode electrode and the cathode electrode, the electropositive holes passing through the hole transmission layer and the electronegative electrons passing through the electron injection layer are transmitted to the light-emitting layer, in which they meet to form excitons, so that the light-emitting layer emits visible light.

For solving a technical problem of screen flicker caused by external electromagnet interference, generally, a shielding film is disposed on a non-display surface of the flexible display panel. The flexible display panel includes a flexible substrate, a buffer layer, a display function layer, a shielding layer, and a bonding layer. The shielding layer 12 and the bonding layer 14 are disposed on a back side of the flexible substrate. Phenomenon such as deformation, wrinkle, uneven thickness and so on, may easily happen during processing of the flexible substrate, so that a shielding effect of the shielding film may not be uniform, and thus the display effect may not be uniform. In addition, before or during the process of adhering the shielding film to the flexible substrate, foreign matters adhered to the back side of the flexible substrate, such as smudginess and particles, may remain between the flexible substrate and the shielding film after adhering, so that the shielding effect of the shielding film may not be uniform, and thus the display effect may not be uniform. Furthermore, a whole thickness of the display panel is increased caused by adhering the shielding film, which is not convenient for bending.

SUMMARY

In view of the above problems, the present disclosure provides technical solutions as follows.

In a first aspect, the present disclosure provides a flexible display panel, including a first flexible substrate, a buffer layer, a display function layer, and a conduction function layer, wherein the buffer layer and the display function layer are sequentially disposed on a first side of the first flexible substrate, the conduction function layer is disposed between the first flexible substrate and the display function layer, and the conduction function layer is connected to a constant potential through a through-hole or by an end portion of the conduction function layer.

In a second aspect, the present disclosure provides a flexible display device, including a flexible display panel and a module middle frame, wherein the module middle frame includes a conduction portion providing a constant potential, the end portion of the conduction function layer is exposed outside, and the end portion is electrically connected to the conduction portion, and wherein the flexible display panel includes: a first flexible substrate, a buffer layer, a display function layer, and a conduction function layer, wherein the buffer layer and the display function layer are sequentially disposed on a first side of the first flexible substrate, the conduction function layer is disposed between the first flexible substrate and the display function layer, and the conduction function layer is connected to a constant potential through a through-hole or by an end portion of the conduction function layer.

By arranging the conduction function layer and connecting to the constant potential, an external interference signal from a back side of the substrate can be effectively shielded, and the conduction function layer can also serve as a blocking layer. In addition, influence of smudginess and particles of the back side of the flexible substrate on a display effect can be prevented.

BRIEF DESCRIPTION OF DRAWINGS

Accompanying drawings described herein are used for providing further understanding of the present disclosure, which constitute a part of the present disclosure, exemplary embodiments and description of the present disclosure are used to explain the present disclosure, which do not constitute any improper limitation to the present disclosure.

DESCRIPTION OF EMBODIMENTS

Some terms have been used to represent specific components in the specification and the claims. It should be understood by those skilled in the art that a hardware manufacturer may call a same component with different names. In the specification and the claims, components are distinguished by functional difference but not by name difference. "Comprise" or "include" used in the specification and the claims is an open language, and therefore should be interpreted as "include but be not limited to". "Substantially" refers to in an acceptable range of error, those skilled in the art can solve the technical problem in a certain range of error, and basically reach the technical effect. Descriptions in the specification are preferred embodiments of the present disclosure, while the description is for the purpose of illustrating the general principles of the present disclosure, rather than limitations to the scope of the present disclosure. The protection scope of the present disclosure is defined by the appended claims.

The present disclosure provides a flexible display panel. The flexible display panel includes a first flexible substrate, a buffer layer, a display function layer, and a conduction function layer. The buffer layer and the display function layer are sequentially disposed on a first side of the first flexible substrate. The conduction function layer is disposed between the first flexible substrate and the display function layer. The conduction function layer is connected to a constant potential through a through-hole or by an end portion.

Figure 1:
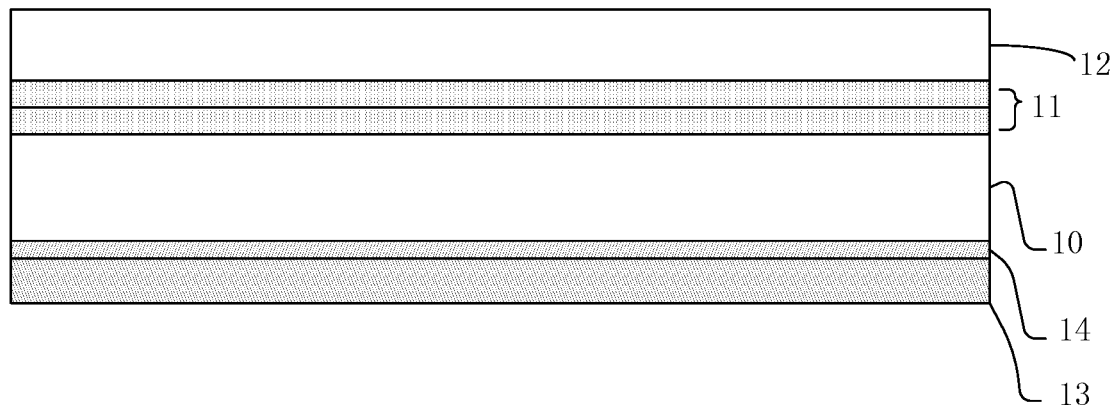
FIG. 1 illustrates a cross-sectional view of a flexible display panel in the related art.

As shown in FIG. 1, the flexible display panel includes a flexible substrate 10, a buffer layer 11, a display function layer 12, a shielding layer 12, and a bonding layer 14. The shielding layer 12 and the bonding layer 14 are disposed on a back side of the flexible substrate 10. Phenomenon such as deformation, wrinkle, uneven thickness and so on, may easily happen during processing of the flexible substrate 10, so that a shielding effect of the shielding film 13 may not be uniform, and thus the display effect may not be uniform. In addition, before or during the process of adhering the shielding film 13 to the flexible substrate 10, foreign matters adhered to the back side of the flexible substrate 10, such as smudginess and particles, may remain between the flexible substrate 10 and the shielding film 13 after adhering, so that the shielding effect of the shielding film 13 may not be uniform, and thus the display effect may not be uniform. Furthermore, a whole thickness of the display panel is increased caused by adhering the shielding film, which is not convenient for bending.

Figure 2:
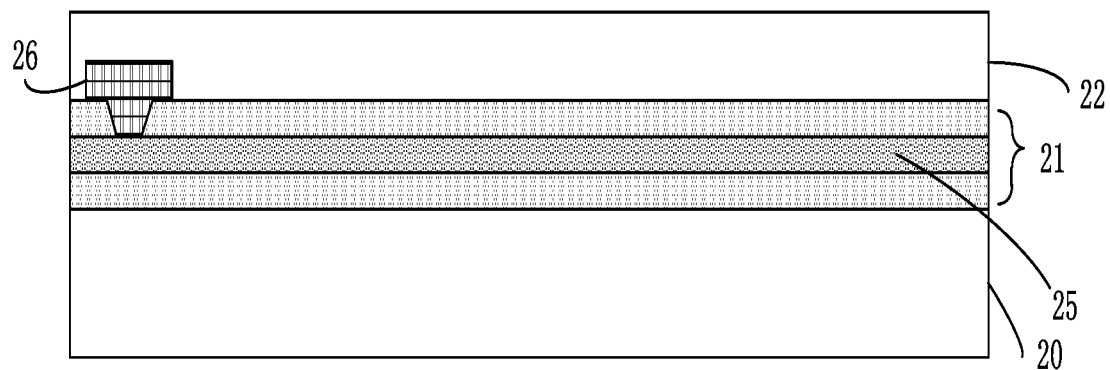
FIG. 2 illustrates a cross-sectional view of a flexible display panel according to an embodiment of the present disclosure, in which a conduction function layer is connected to a constant potential through a through-hole.

As shown in FIG. 2, which is a cross-sectional view of a flexible display panel according to an embodiment of the present disclosure, the flexible display panel includes a first flexible substrate 20, a buffer layer 21, a display function layer 22, and a conduction function layer 25. The buffer layer 21 and the display function layer 22 are sequentially disposed on a first side of the first flexible substrate 20. The conduction function layer 25 is disposed between the first flexible substrate 20 and the display function layer 22. The conduction function layer 25 is connected to a constant potential through a through-hole.

The connecting manner through a through-hole is shown in FIG. 2: by defining the through-hole in the buffer layer 21, the conduction function layer is electrically connected to a constant potential line 26 in an upper layer through the through-hole.

Figure 3:
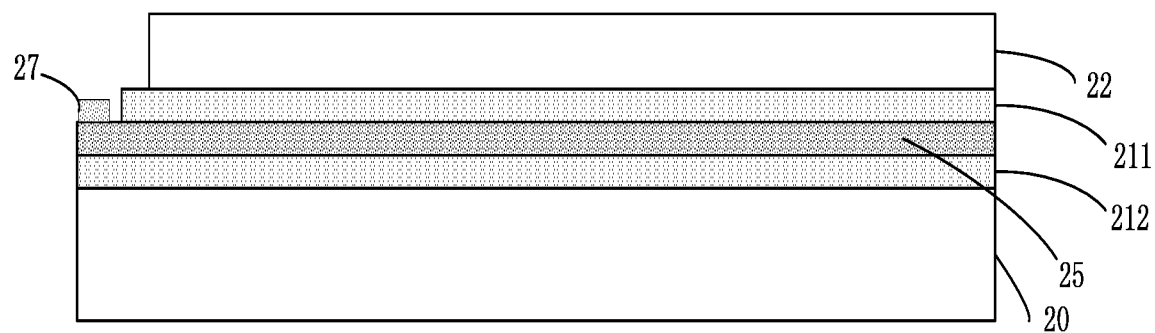
FIG. 3 illustrates a cross-sectional view of a flexible display panel according to an embodiment of the present disclosure, in which a conduction function layer is connected to a constant potential by an end portion.

The connecting manner by an end portion is shown in FIG. 3, stacking of the layers of the flexible display panel is the same as shown in FIG. 2, which is not repeated herein. The buffer layer 21 includes a first buffer layer 211 and a second buffer layer 212. The conduction function layer 25 is disposed between the first buffer layer 211 and the second buffer layer 212. An end portion of the conduction function layer 25 is exposed from an edge of the first buffer layer 211, and is electrically connected to a constant potential line 27.

Figure 4:
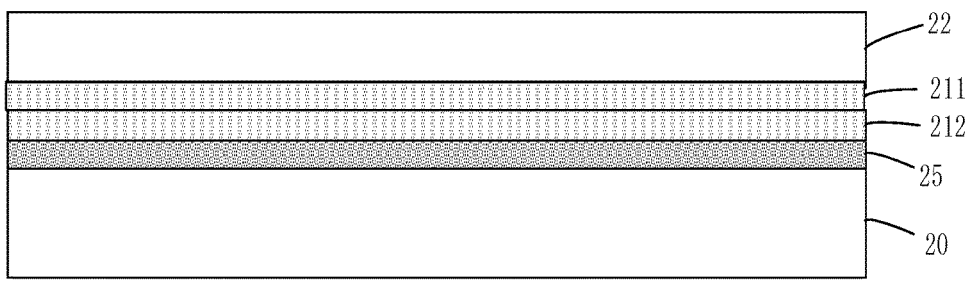
FIG. 4 illustrates a cross-sectional view of a flexible display panel according to another embodiment of the present disclosure.

FIG. 4 is a cross-sectional view of another flexible display panel provided by the present disclosure. The flexible display panel includes a first flexible substrate 20, a buffer layer 21, a display function layer 22, and a conduction function layer 25. The buffer layer 21 and the display function layer 22 are sequentially disposed on a first side of the first flexible substrate 20. The conduction function layer 25 is disposed between the first flexible substrate 20 and the buffer layer 21. The conduction function layer 25 is connected to a constant potential (not shown) through a through-hole or by an end portion. A position relation between the conduction function layer and the buffer layer as shown in FIG. 3 is convenient for defining a through-hole or for an electrically connection with an end portion. A position relation between the conduction function layer and the buffer layer as shown in FIG. 4 is convenient for an insulation function of the buffer layer, thereby alleviating dissipation of atoms or foreign matters of the conduction function layer to the display function layer, which may affect the display function, especially, for alleviating dissipation of atoms or foreign matters of the conduction function layer to a polysilicon semiconductor layer of the display function layer, which may affect switch performance of a thin film transistor.

Figure 5:
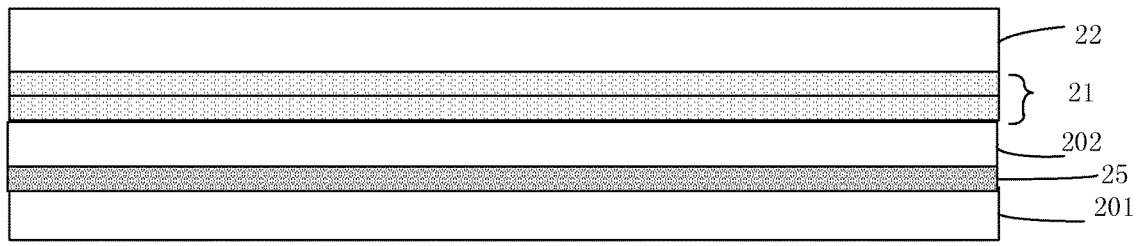
FIG. 5 illustrates a cross-sectional view of a flexible display panel according to another embodiment of the present disclosure.

FIG. 5 is a cross-sectional view of another flexible display panel provided by the present disclosure. The flexible display panel includes a first flexible substrate 201, a second flexible substrate 202, a buffer layer 21, a display function layer 22, and a conduction function layer 25. The conduction function layer 25 is disposed between the first flexible substrate 201 and the second flexible substrate 202. The conduction function layer 25 is connected to a constant potential (not shown) through a through-hole or by an end portion. With such a position relation between the conduction function layer, the buffer layer, and the flexible substrate as shown in FIG. 5, in one aspect, the conduction function layer is completely insulated from the buffer layer, which prevents influence of the conduction function layer on the buffer layer and the display function layer; in the other aspect, the conduction function layer is disposed between the first flexible substrate 201 and the second flexible substrate 202, which improves strength of the flexible substrate and bending performance in some application scenarios that require bending performance.

The conduction function layer of the flexible display panel in the present disclosure is made of at least one of metal, indium tin oxide, a conductive carbon material, and an organic conductive material, such as copper, silver, aluminum, graphite, and so on.

Hereinafter, a material composition and an internal structure of the conduction function layer are described in detail, but are not limited to embodiments as follows.

In an optional embodiment, the conduction function layer includes a plurality of conduction function sub-layers, and at least one of the conduction function sub-layers is made of a conductive carbon material or an organic conductive material.

Figure 6:
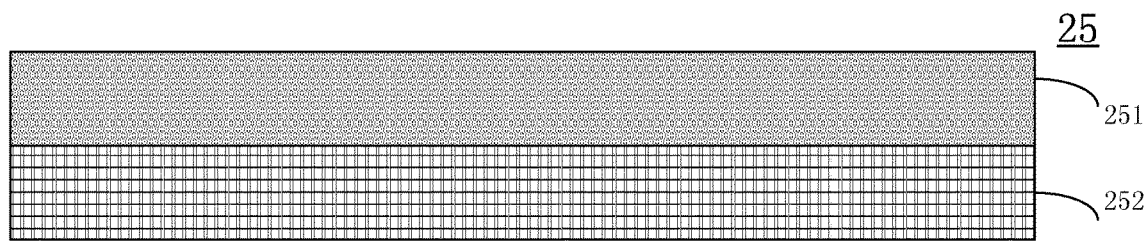
FIG. 6 illustrates an internal structure of a conduction function layer.

FIG. 6 illustrates an internal structure of the conduction function layer. The conduction function layer 25 includes two conduction function sub-layers, one of the two conduction function sub-layers (251) is made of a conductive carbon material or an organic conductive material, and the other one of the two conduction function sub-layers (252) is made of an entire metallic sheet or a metallic grid. The conduction function layer 25 is in a double-layer type, and one of the double layers is made of a conductive carbon material or an organic conductive material, so that toughness of the substrate is improved, and stress between the substrate and the conduction function layer is relieved.

Figure 7:
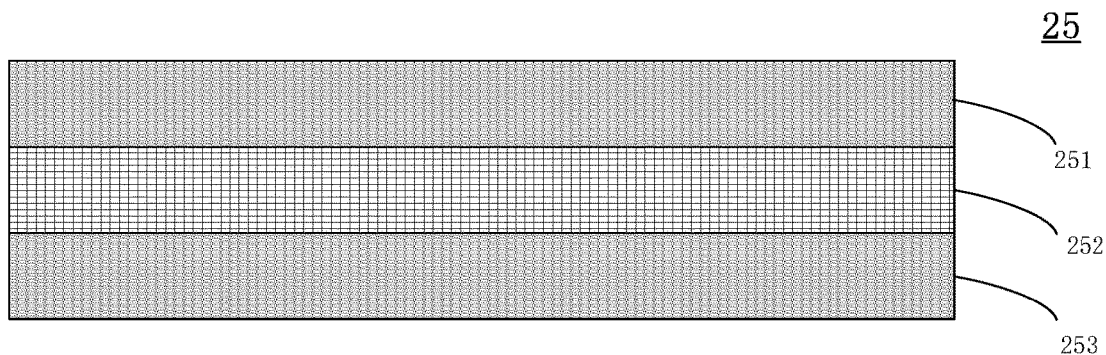
FIG. 7 illustrates another internal structure of a conduction function layer.

FIG. 7 illustrates another internal structure of the conduction function layer. The conduction function layer 25 includes three conduction function sub-layers, a top one and a bottom one of the three conduction function sub-layers (251, 253) are made of a conductive carbon material or an organic conductive material, and the other one of the three conduction function sub-layers (252) is made of an entire metallic sheet or a metallic grid. The conduction function layer 25 is in a three-layer type, and the top one and the bottom one of the three the double layers is made of a conductive carbon material or an organic conductive material, so that toughness of the substrate is improved, and stress between the substrate and the conduction function layer is relieved.

In another optional embodiment, the conduction function layer includes a plurality of conduction function sub-layers. At least two conduction function sub-layers have meshes, in which one conduction function sub-layer on the first flexible substrate overlaps meshes of the other conduction function sub-layer.

Figure 8:
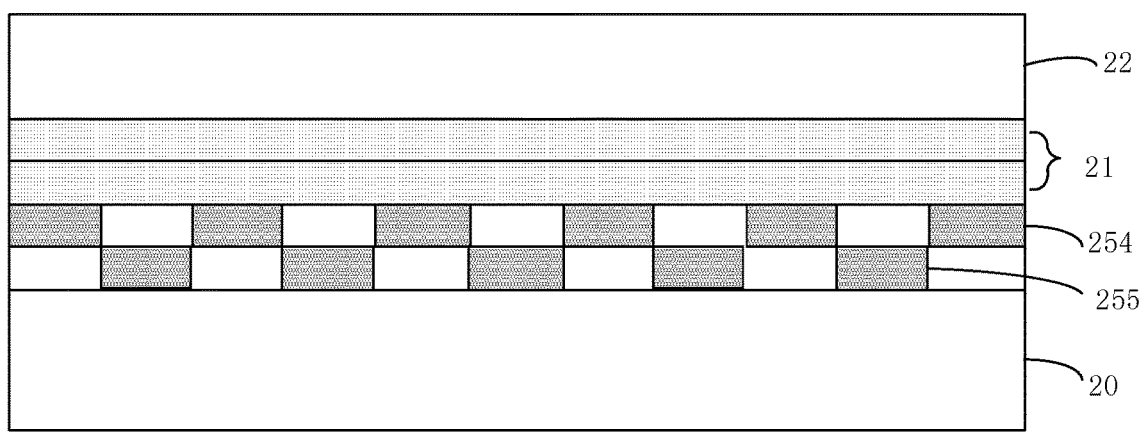
FIG. 8 illustrates a structural schematic view of a conduction function layer, in which the conduction function layer is a double-layer conductive grid.

As shown in FIG. 8, a flexible display panel includes a first flexible substrate 20, a buffer layer 21, a display function layer 22, and a conduction function layer 25. The conduction function layer 25 is disposed between the first flexible substrate 20 and the buffer layer 21. The conduction function layer 25 includes two conduction function sub-layers 254, 255, the conduction function sub-layer 254 on the first flexible substrate overlaps meshes of the conduction function sub-layer 255. Two conduction function sub-layers with meshes are composited, so that both strength and toughness of the flexible display panel are improved, and signals from a lower side of the first flexible substrate can be completely shielded by the conduction function layer, thus the display function layer will not be affected.

Figure 9:
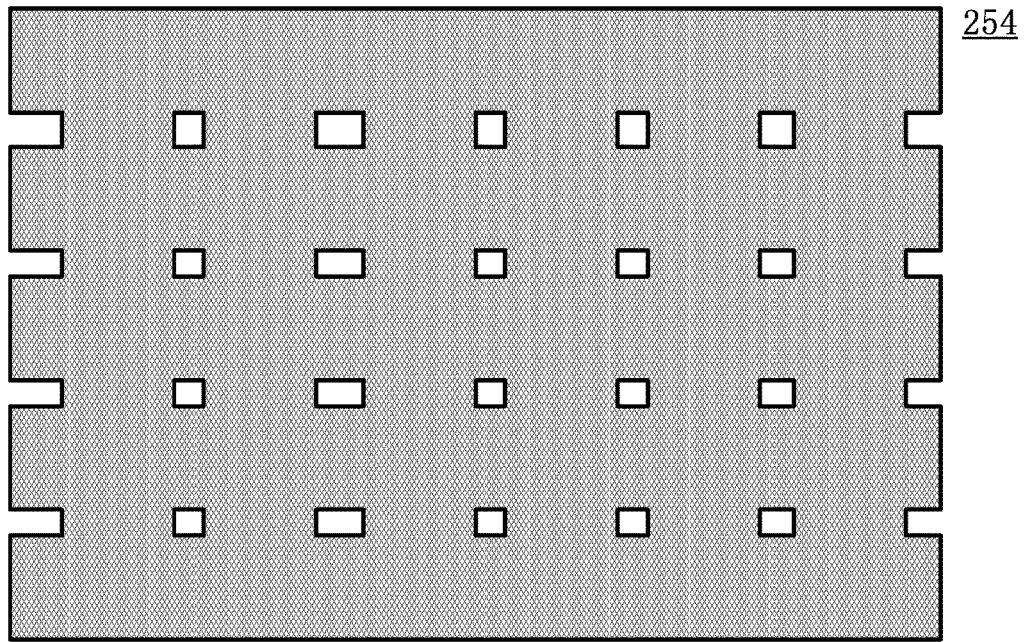
FIG. 9 illustrates a top view of a conduction function sub-layer 254.
Figure 10:
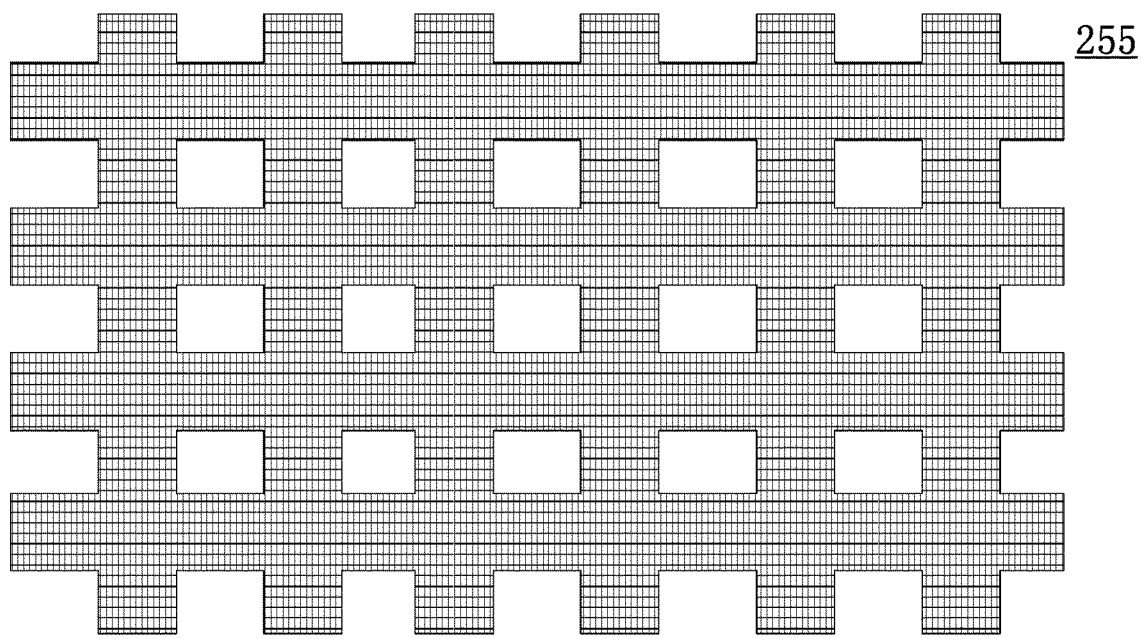
FIG. 10 illustrates a top view of a conduction function sub-layer 255.
Figure 11:
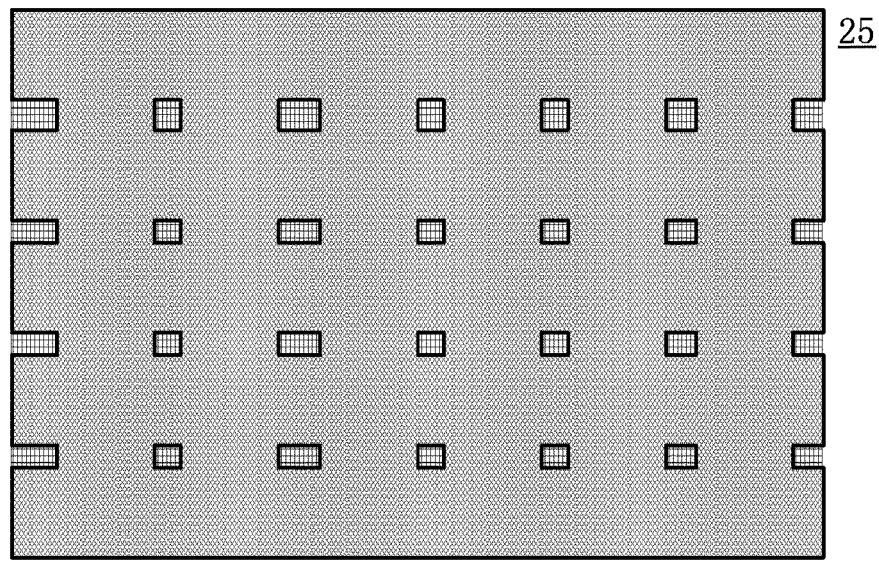
FIG. 11 illustrates a schematic view showing overlapping of two conduction function sub-layers 254, 255.

FIGS. 9 and 10 are top views of the two conduction function sub-layers 254, 255 as shown in FIG. 8, and FIG. 11 is a schematic view illustrating overlapping of the two conduction function sub-layers 254, 255. In any portion, in a direction perpendicular to the first flexible substrate, at least one conduction function sub-layer is disposed between the first flexible substrate and the display function layer, which can guarantee the shielding function of the conduction function layer to the display function layer.

Figure 12:
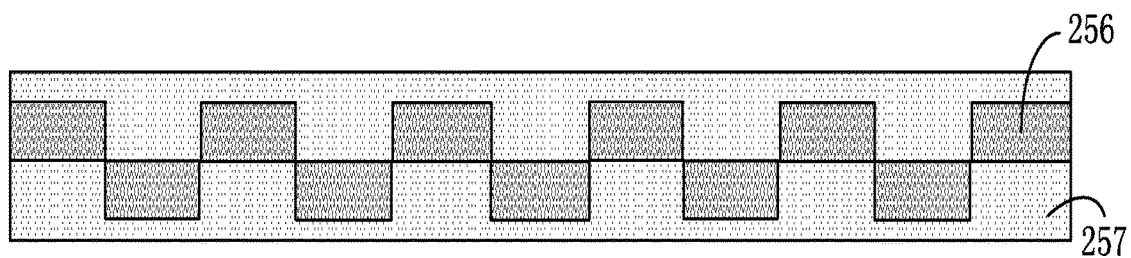
FIG. 12 illustrates another internal structure of a conduction function layer.
Figure 13:
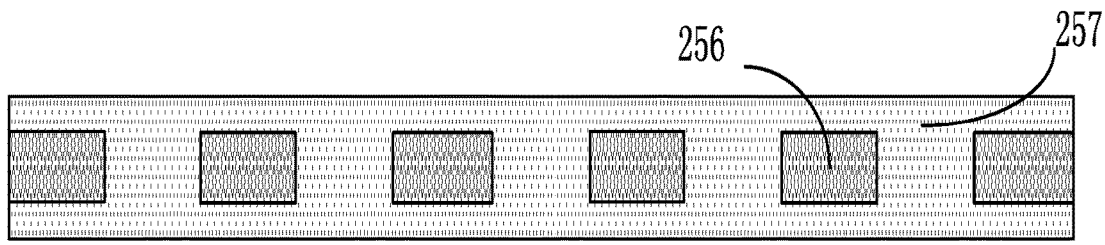
FIG. 13 illustrates another internal structure of a conduction function layer.

FIGS. 12 and 13 show other internal structures of the conduction function layer. The conduction function layer includes a conduction grid 256 inside the conduction function layer and a conduction body 257 filling and surrounding the conduction grid 256. The conduction grid is made of metal or indium tin oxide, and the conduction body is made of a conductive carbon material or an organic conductive material, such as conductive polymer materials, conductive ink materials, graphite powder, graphene, and so on. The conduction grid 256 can include two staggered layers of conduction grids as shown in FIG. 8 or can include only one layer of conduction grid as shown in FIG. 13.

In addition, the conduction function layer can include two staggered layers of conduction grids and an insulation body. With such an internal structure, the conduction grid is filled in a relatively flexible body, so that toughness of the substrate is improved; the conduction function layer is conductive, so that the conduction performance and the shielding performance can also be guaranteed.

A connection manner between the conduction function layer and the constant potential is described in detail as follows. It should be noted that, the connection manner between the conduction function layer and the constant potential is not limited to the following embodiments.

Figure 14:
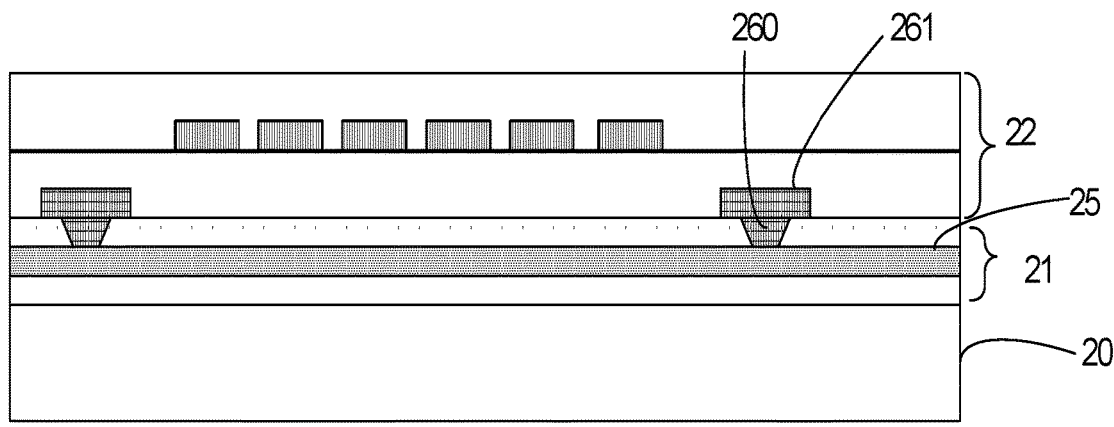
FIG. 14 illustrates a connection manner between a conduction function layer and a constant potential within a flexible display panel according to an embodiment of the present disclosure.

FIG. 14 illustrates a connection manner between the conduction function layer and the constant potential within a flexible display panel in the present disclosure. The flexible display panel includes a first flexible substrate 20, a buffer layer 21, a display function layer 22, and a conduction function layer 25. The buffer layer 21 and the display function layer 22 are sequentially disposed on a first side of the flexible substrate 20. The buffer layer 21 includes a first buffer layer 211 and a second buffer layer 212. The conduction function layer 25 is disposed between the first buffer layer 211 and the second buffer layer 212. The conduction function layer 25 is connected to a constant potential through a through-hole 260. The through-hole 260 can be defined in a border area, four corners, or a binding area connected to external FPC or IC. The number of the through-hole 260 can be one or more than one, and the through-hole 260 is defined in four borders of the flexible display panel and surrounds the display area. A constant potential element 261 providing the constant potential can be any one of low potential line, power signal line, reference potential line, control chip, and flexible circuit board.

As shown in FIG. 14, the through-hole is defined through the buffer layer, and the conduction function layer is electrically connected to the constant potential element 261 in an upper layer through the through-hole. With such a structure, the conduction function layer and its potential connection structure can be integrated into the interior of the flexible display panel without an additional external connection.

Figure 15:
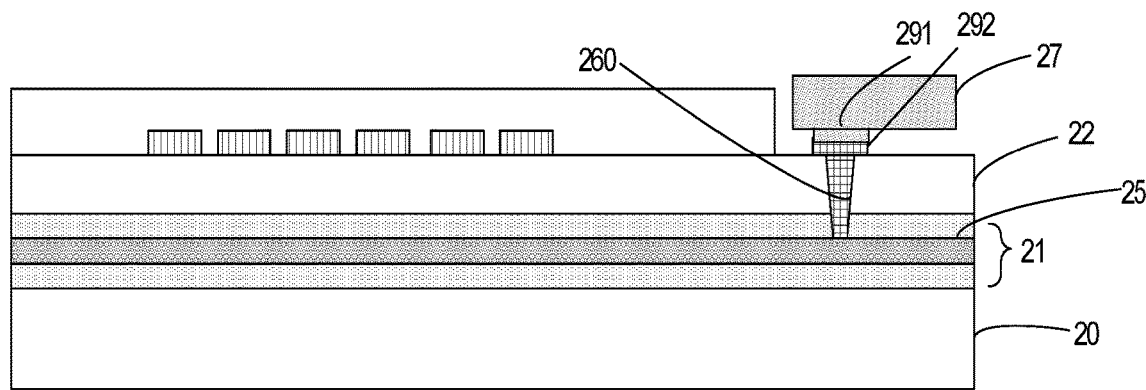
FIG. 15 illustrates a connection manner between a conduction function layer and a control chip through a through-hole.
Figure 16:
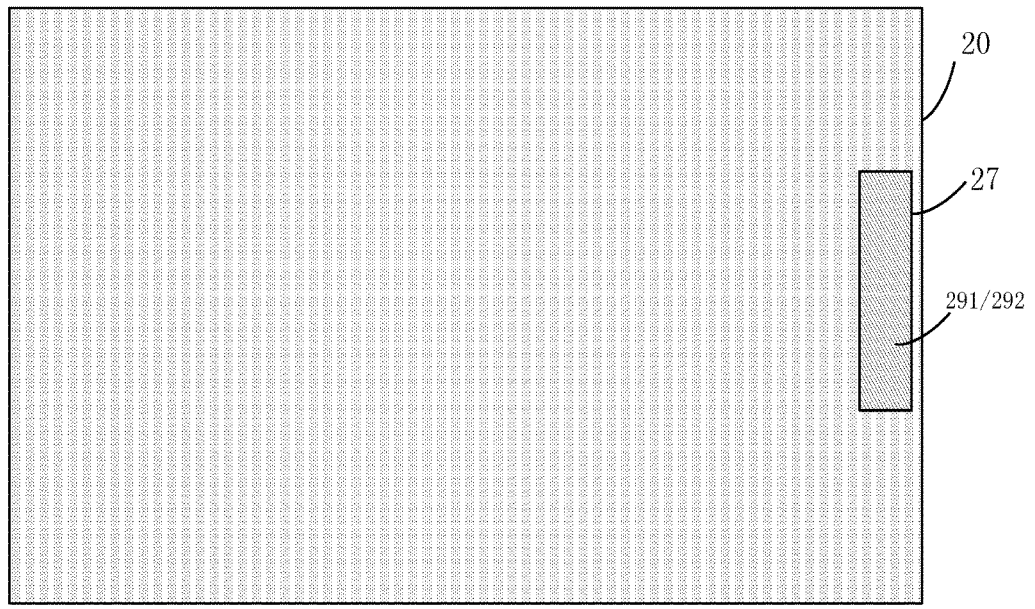
FIG. 16 illustrates a top view of a connection manner between a conduction function layer and a control chip through a through-hole.

The constant potential of the present disclosure can be obtained from an external input. FIG. 15 illustrates a situation that the conduction function layer is connected to a control chip through the through-hole. The control chip 27 includes a first terminal 291. One end of the through-hole is connected to the conduction function layer, and the other end of the through-hole is connected to a second terminal 292 on the display function layer. The first terminal 291 is electrically connected to the second terminal 292 by binding. The control chip provides the constant potential to the conduction function layer. FIG. 16 is a top view of the situation that the conduction function layer is connected to the control chip through the through-hole.

Figure 17:
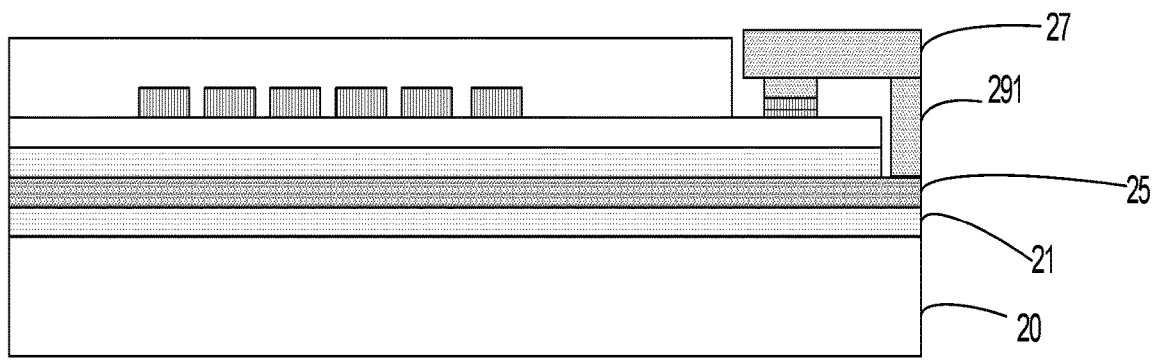
FIG. 17 illustrates a connection manner between a conduction function layer and a control chip by an end portion.
Figure 18:
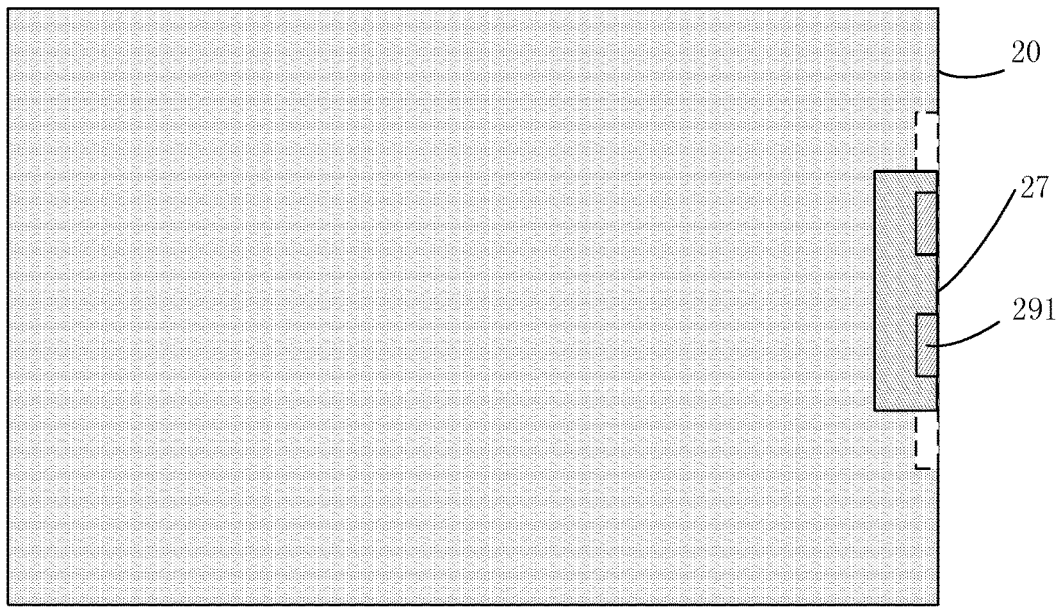
FIG. 18 illustrates a top view of a connection manner of a conduction function layer and a control chip by an end portion.

FIG. 17 illustrates a situation that the conduction function layer is connected to a control chip by an end portion. The end portion of the conduction function layer is electrically connected to a first binding terminal 291 of the control chip by directly binding. The control chip 27 provides a constant potential to the conduction function layer by the first binding terminal 291. FIG. 18 is a top view of the situation that the conduction function layer is connected to a control chip by an end portion.

Figure 19:
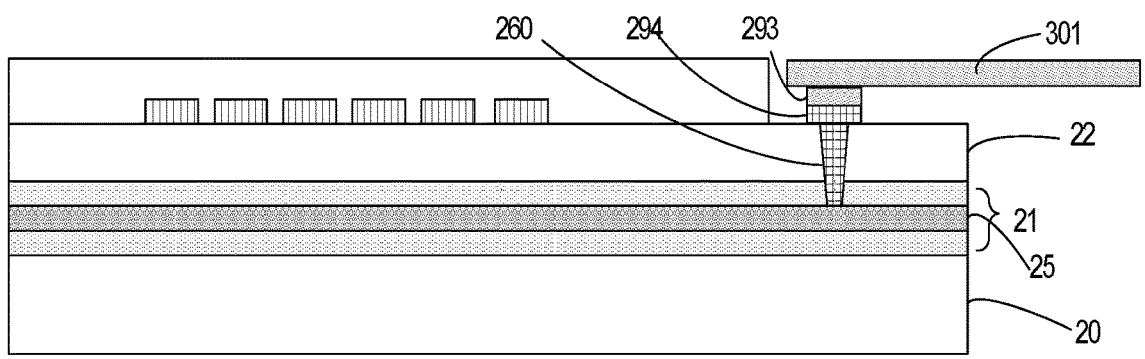
FIG. 19 illustrates a connection manner between a conduction function layer and a first flexible circuit board through a through-hole.

FIG. 19 illustrates a situation that a conduction function layer is connected to the flexible circuit board through a through-hole. The flexible circuit board includes a first flexible circuit board 301. The first flexible circuit board 301 includes a third binding terminal 293 electrically connected to the flexible display panel and providing a constant potential. The conduction function layer is electrically connected to the third binding terminal 293 through the through-hole.

Figure 20:
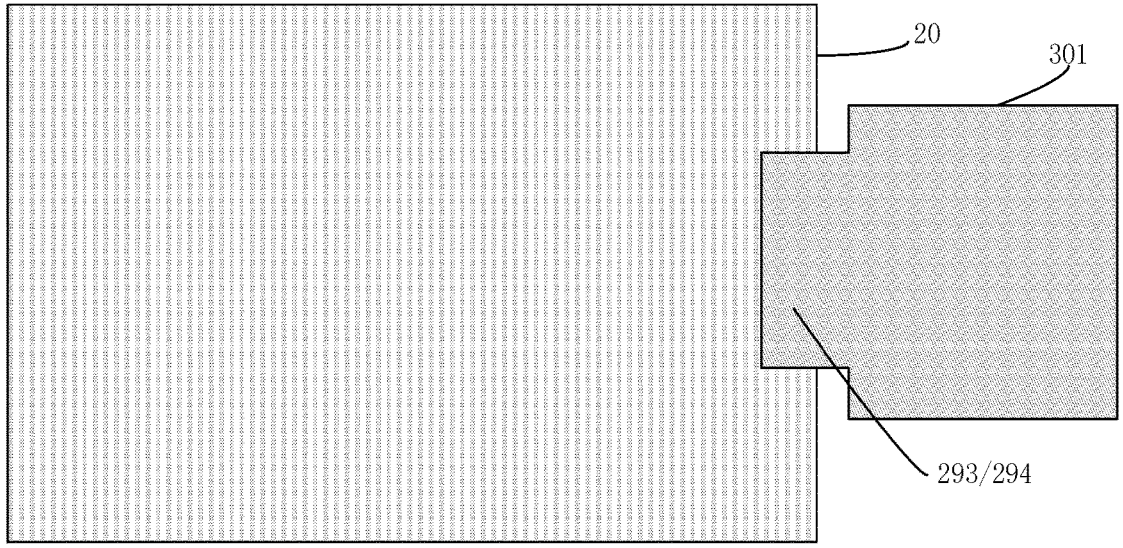
FIG. 20 illustrates a top view of a connection manner between a conduction function layer and a first flexible circuit board through a through-hole.

The first flexible circuit board 301 includes the third binding terminal 293. One end of the through-hole is connected to the conduction function layer, and the other end of the through-hole is connected to a fourth terminal 294 on the display function layer. The fourth terminal 294 is electrically connected to the third terminal 293 by binding. The first flexible circuit board 301 provides the constant potential to the conduction function layer. FIG. 20 is a top view of the situation that the conduction function layer is connected to the first flexible circuit board through the through-hole.

Figure 21:
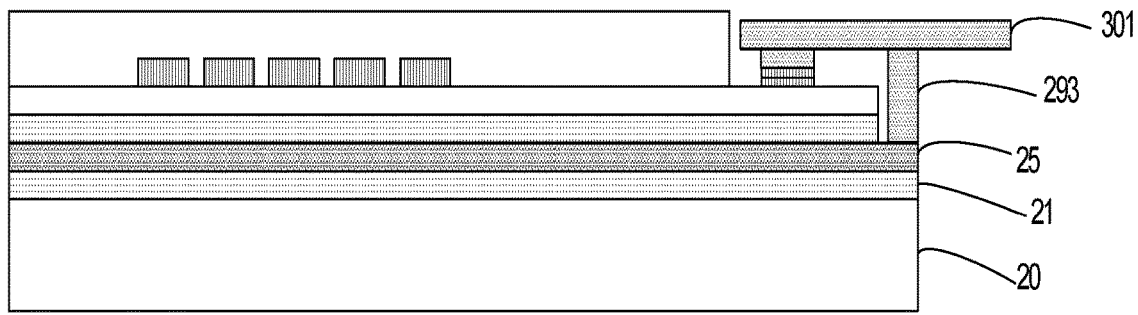
FIG. 21 illustrates a connection manner between a conduction function layer and a first flexible circuit board by an end portion.
Figure 22:
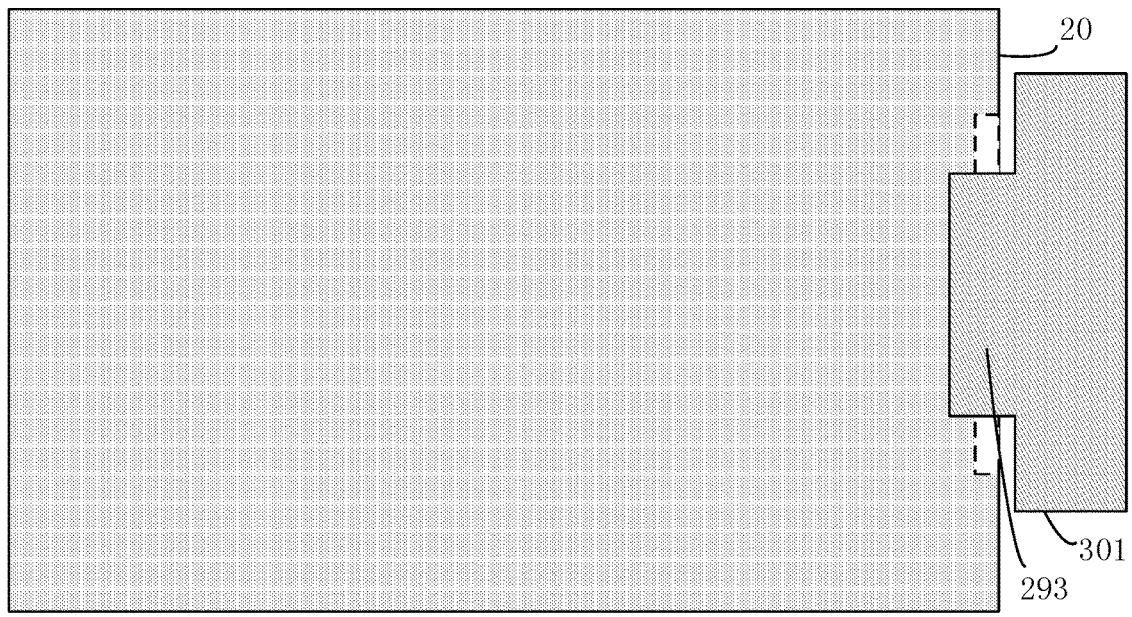
FIG. 22 illustrates a top view of a connection manner between a conduction function layer and a first flexible circuit board by an end portion.

FIG. 21 illustrates a situation that a conduction function layer is connected to a flexible circuit board by an end portion. The end portion of the conduction function layer is electrically connected to a third binding terminal 293 of the first flexible circuit board 301 by directly binding. The first flexible circuit board 301 provides a constant potential to the conduction function layer by the third binding terminal 293. FIG. 22 is a top view of the situation that a conduction function layer is connected to a first flexible circuit board by an end portion.

In a manner of providing a constant potential by electrically connecting the conduction function layer with the control chip or the flexible circuit board, a constant potential element is not needed in the display function area of the flexible display panel, so as to save space of the display function area.

The present disclosure further provides a flexible display device including any one of the flexible display panels as described above. In the flexible display device of the present disclosure, a constant potential element in the flexible display panel can be used to provide a constant potential to the conduction function layer. In addition, optionally, in the flexible display device of the present disclosure, an external element can be used to provide a constant potential to the conduction function layer, or both an external element and a constant potential element in the flexible display panel can be used to provide a constant potential to the conduction function layer. Take a structure of "an external element can be used to provide a constant potential to the conduction function layer" as an example, the flexible display device includes a module middle frame 30. The module middle frame 30 includes a conduction portion 301 providing a constant potential, an end portion of the conduction function layer is exposed outside, and the end portion of the conduction function layer is electrically connected to the conduction portion 301.

Figure 23:
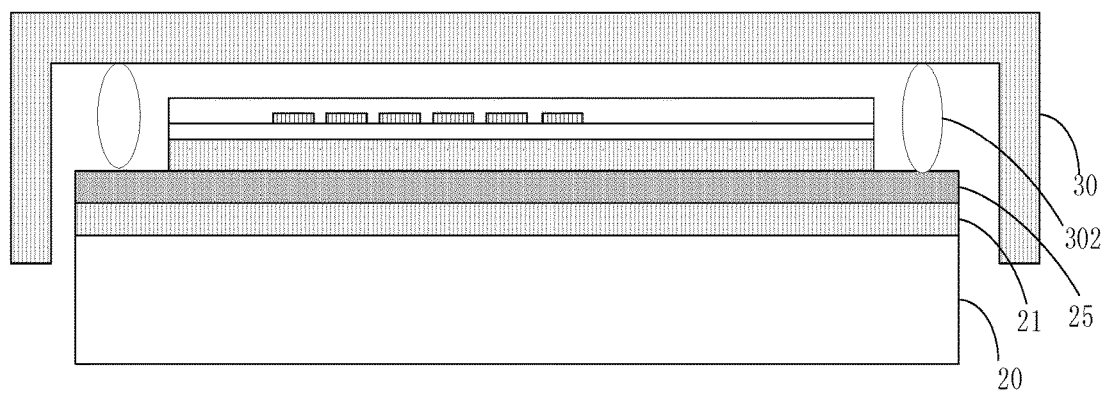
FIG. 23 illustrates a connection manner between a conduction function layer and a module middle frame.
Figure 24:
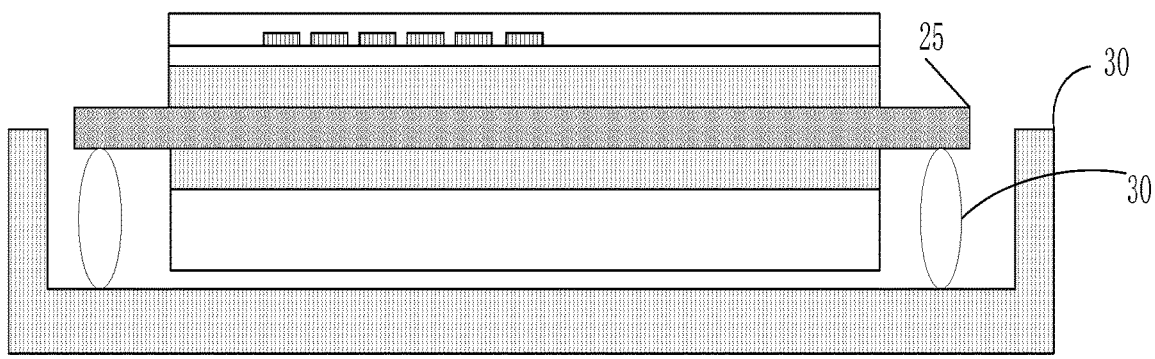
FIG. 24 illustrates another connection manner between a conduction function layer and a module middle frame.

As shown in FIG. 23, the module middle frame 30 is disposed on a side of the conduction function layer away from the flexible substrate. The module middle frame 30 is electrically connected to the conduction function layer by conductive silver paste. Another structure of the flexible display device is shown in FIG. 24. The module middle frame 30 is disposed on a side of the conduction function layer adjacent to the flexible substrate, and is electrically connected to the conduction function layer by conductive silver plasma 302. The constant potential is provided to the conduction function layer by the module middle frame, so that a constant potential element is not needed in the flexible display panel, current process and performance of the display panel will not be affected, and a better anti-static performance can be obtained for the flexible display panel and the flexible display device.

Figure 25:
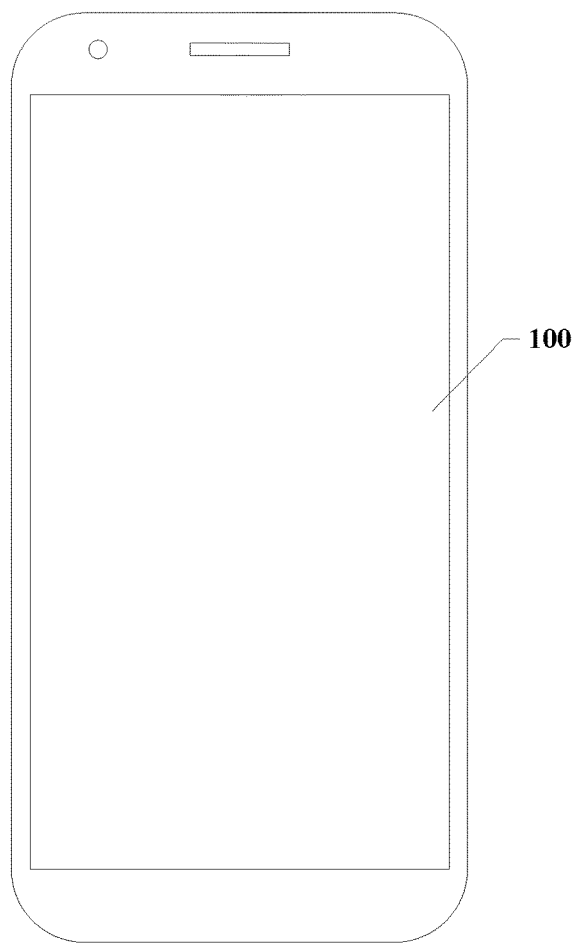
FIG. 25 illustrates a shape of a flexible display device of the present disclosure.

FIG. 25 illustrates a shape of the flexible display device including the flexible display panel in the above embodiments. The flexible display device can be any products or components with display function, such as mobile phone, tablet computer, TV, displayer, laptop computer, digital photo frame, navigator, and so on. Embodiments of the display device can be referred to the embodiments of the above described flexible display panels 100, which will not be repeated herein.

What is claimed is:

1. A flexible display panel, comprising:
   a first flexible substrate,
   a buffer layer,
   a display function layer, and
   a conduction function layer,
   wherein the buffer layer and the display function layer are sequentially disposed on a first side of the first flexible substrate,
   the conduction function layer is disposed between the first flexible substrate and the display function layer,
   the conduction function layer is connected to a constant potential through a through-hole or by an end portion of the conduction function layer;
   the buffer layer comprises a first buffer sub-layer and a second buffer sub-layer, and the conduction function layer is disposed between the first buffer sub-layer and the second buffer sub-layer;
   the conduction function layer comprises a plurality of conduction function sub-layers,
   at least two of the plurality of conduction function sub-layers have meshes, and one of the at least two of the plurality of conduction function sub-layers on the first flexible substrate overlaps meshes of the other one of the at least two of the plurality of conduction function sub-layers.

2. The flexible display panel according to claim 1, wherein the conduction function layer is disposed between the first flexible substrate and the buffer layer.

3. The flexible display panel according to claim 1, further comprising a second flexible substrate placed on a second side of the first flexible substrate, wherein the second side is a side of the first flexible substrate away from the buffer layer, and the conduction function layer is disposed between the first flexible substrate and the second flexible substrate.

4. The flexible display panel according to claim 1, wherein the display function layer comprises a constant potential element, the conduction function layer is electrically connected to the constant potential element through the through-hole.

5. The flexible display panel according to claim 4, wherein the constant potential element comprises one of a low potential line, a power signal line and a reference potential line.

6. The flexible display panel according to claim 1, wherein the conduction function layer is made of at least one of metal, indium tin oxide, conductive carbon material, and organic conductive material.

7. The flexible display panel according to claim 1, wherein the conduction function layer comprises a plurality of conduction function sub-layers, and at least one of the plurality of conduction function sub-layers is made of conductive carbon material or organic conductive material.

8. The flexible display panel according to claim 7, wherein the conduction grid is made of metal or indium tin oxide, and the conduction body is made of conductive carbon material or organic conductive material.

9. The flexible display panel according to claim 1, wherein the conduction function layer comprises a conduction grid within the conduction function layer and a conduction body filling and surrounding the conduction grid.

10. The flexible display panel according to claim 1, wherein the end portion of the conduction function layer is exposed outside the conduction function layer, and the end portion is provided with a constant potential by an external device.

11. The flexible display panel according to claim 1, further comprising a control chip, wherein the control chip comprises a first binding terminal, the first binding terminal is electrically connected to the flexible display panel and provides a constant potential, and the conduction function layer is electrically connected to the first binding terminal through the through-hole or by the end portion of the conduction function layer.

12. The flexible display panel according to claim 11, further comprising a second binding terminal, wherein the conduction function layer is connected to the second binding terminal through the through-hole, and the first binding terminal is electrically connected to the second binding terminal by binding.

13. The flexible display panel according to claim 11, wherein the end portion of the conduction function layer is exposed outside the conduction function layer, and the end portion is electrically connected to the first binding terminal by directly binding.

14. The flexible display panel according to claim 1, further comprising a first flexible circuit board, wherein the first flexible circuit board comprises a third binding terminal electrically connected to the flexible display panel and providing a constant potential, and the conduction function layer is electrically connected to the third binding terminal through the through-hole or by the end portion.

15. The flexible display panel according to claim 14, further comprising a fourth binding terminal, wherein the conduction function layer is connected to the fourth binding terminal through the through-hole, and the third binding terminal is electrically connected to the fourth binding terminal by binding.

16. The flexible display panel according to claim 14, wherein the end portion of the conduction function layer is exposed outside, and the end portion is electrically connected to the third binding terminal by directly binding.

17. A flexible display device, comprising a flexible display panel and a module middle frame, wherein the flexible display panel comprises:

a first flexible substrate, a buffer layer, a display function layer, and a conduction function layer, wherein the buffer layer and the display function layer are sequentially disposed on a first side of the first flexible substrate, the conduction function layer is disposed between the first flexible substrate and the display function layer, and the conduction function layer is connected to a constant potential through a through-hole or by an end portion of the conduction function layer; the buffer layer comprises a first buffer sub-layer and a second buffer sub-layer, and the conduction function layer is disposed between the first buffer sub-layer and the second buffer sub-layer;

wherein the module middle frame comprises a conduction portion providing the constant potential, the end portion of the conduction function layer is exposed outside, and the end portion is electrically connected to the conduction portion; and wherein the conduction function layer comprises a plurality of conduction function sub-layers, at least two of the plurality of conduction function sub-layers have meshes, and one of the at least two of the plurality of conduction function sub-layers on the first flexible substrate overlaps meshes of the other one of the at least two of the plurality of conduction function sub-layers.

18. The flexible display device according to claim 17, wherein the end portion is electrically connected to the conduction portion by silver paste.

* * * * *